United States Patent [19]

Hikima

[11] Patent Number: 4,952,945
[45] Date of Patent: Aug. 28, 1990

[54] EXPOSURE APPARATUS USING EXCIMER LASER SOURCE

[75] Inventor: Ikuo Hikima, Kawasaki, Japan

[73] Assignee: Nikon Corporation, Tokyo, Japan

[21] Appl. No.: 246,197

[22] Filed: Sep. 19, 1988

[30] Foreign Application Priority Data

Sep. 25, 1987 [JP] Japan .................................. 62-240148

[51] Int. Cl.⁵ .......................... G01D 15/14; G01J 1/20
[52] U.S. Cl. .................................... 346/108; 250/226; 250/201.1
[58] Field of Search ...................... 346/76 L, 108, 160; 250/201

[56] References Cited

U.S. PATENT DOCUMENTS 4,458,994 7/1984 Jain et al. .
4,629,313 12/1986 Tanimoto .............................. 355/53
4,666,273 5/1987 Shimizu et al. .
4,703,166 10/1987 Brunning .............................. 250/201

Primary Examiner—Mark L. Reinhart
Attorney, Agent, or Firm—Shapiro and Shapiro

[57] ABSTRACT

An exposure apparatus comprises a projection optical system, to project the image of an object on a first plane onto a second plane, a laser means for outputting a light beam to the projection optical system for projection, a measuring device for detecting a fluctuation of the optical characteristic of the projection optical system attributable to deviation of the wavelength of the light beam output from the laser and a control device responsive to the measuring device to adjust the wavelength of the light beam.

11 Claims, 2 Drawing Sheets

EXPOSURE APPARATUS USING EXCIMER LASER SOURCE

BACKGROUND OF THE INVENTION

1. Field of the Invention

This invention relates to an exposure apparatus for printing the pattern of a mask on a semi-conductive wafer, for example, in the manufacturing process of semiconductor integrated circuits, and in particular to a projection exposure apparatus utilizing an excimer laser.

2. Related Background Art

A projection exposure apparatus utilizing the output of an excimer laser to transfer the pattern of a mask or reticle (hereinafter referred to as the mask) onto a semicondcutive wafer is known from U.S. Pat. No. 4,458,994.

It is known that the output wavelength of an excimer laser source can be determined variously by the selection of excimer gas, and it is suggested in the aforementioned U.S. patent that when using the output of an excimer laser source as the exposure energy in a lithography system utilizing a projection optical system, it is relatively easy to design the projection optical system so as to be corrected in chromatic aberration relative to the bandwidth of the output wavelength thereof. That is, where the projection optical system is constructed by the use of a plurality of optical elements differing in refractive index, it is possible to correct chromatic aberration relative to a wavelength of a limited bandwidth.

However, in order to enhance the transmittance of the projection optical system, it is preferable that all elements constituting the refracting system of the optical system be formed of quartz. In that case, it is difficult to correct chromatic aberration completely relative to a plurality of wavelengths and therefore, only a single wavelength determined in design must be used as the exposure wavelength.

Accordingly, for such a reason, in an exposure apparatus provided with an excimer laser source, the stability of the wavelength of the laser beam output from the laser source (the stability of the central wavelength and the wavelength range) becomes an important matter in respect of the fluctuation of the projection magnification, the fluctuation of the focus position, etc. Even slight deviation of the wavelength causes significant fluctuation of the projection magnification, fluctuation of the focus position, etc.

SUMMARY OF THE INVENTION

It is an object of the present invention to provide an apparatus for stabilizing the output wavelength of an excimer laser source.

It is another object of the present invention to provide an exposure apparatus provided with an excimer laser source of high stability.

The exposure apparatus of the present invention includes measuring means for detecting the amount of fluctuation of an optical characteristic of a projection optical system, and control means for controlling the output wavelength of the excimer laser source on the basis of the detected amount of fluctuation of the optical characteristic.

Further, means for stabilizing the output wavelength of the excimer laser source is provided. This stabilizing means operates to stabilize the wavelength of the laser beam conforming to the measuring means after said wavelength of the laser beam is controlled by the control means.

In a preferred embodiment of the present invention, the excimer laser source is provided with a Fabry-Pérot etalon for output wavelength selection, and the stabilizing means is provided with a Fabry-Pérot etalon for monitoring the output wavelength.

In the present invention, when the deviation of the output wavelength of the excimer laser source occurs at integer times the free spectral range of the monitoring Fabry-Pérot etalon, the stabilizing means feedback-controls the angle of inclination of the Fabry-Pérot etalon for wavelength selection so that the output wavelength is controlled on the basis of the amount of fluctuation of the optical characteristic of the projection optical system detected by the measuring means and thereafter this output wavelength is stabilized.

As a result, the central wavelength of the output of the excimer laser source is made to accurately coincide with the set wavelength at the starting of the exposure apparatus or even when a long time has elapsed after the exposure apparatus has been started, and the amount of wavelength deviation is held within a predetermined value ($\pm 0.001$ nm).

DESCRIPTION OF THE PREFERRED EMBODIMENTS

Figure 1:
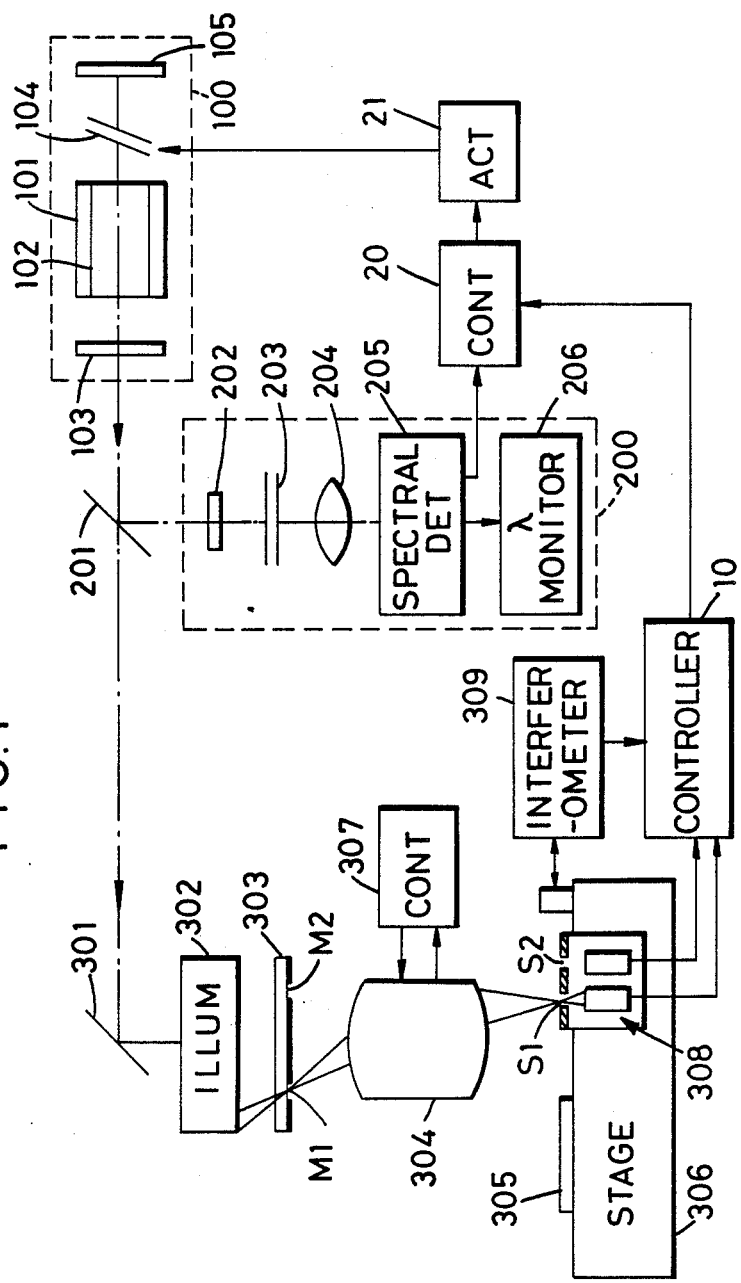
FIG. 1 is a diagram schematically showing the construction of an exposure apparatus provided with an excimer laser device according to a first embodiment of the present invention.

In FIG. 1, an excimer laser source 100 has a laser resonating portion 102 installed in a cavity 101. Also provided in the excimer laser source are a front mirror 103, a rear mirror 105 and a wavelength selecting element 104 constituted by a Fabry-Pérot etalon or a grating. The laser beam reciprocally travels by reflection between the front mirror 103 and the rear mirror 105, and the wavelength range thereof is narrowed by the action of the wavelength selecting element 104 disposed between the two mirrors. By this narrowing, the spectral width of the laser beam using KrF as a laser medium which was of the order of 4 nm becomes 0.005 nm or less. This narrowed laser beam is designed to oscillate through the front mirror 103.

As the wavelength selecting element 104, use is made of a Fabry-Pérot etalon of the type in which the free spectral range (FSR) is appropriately determined and the mirror surface spacing is fixed.

The laser beam thus oscillated from the laser source 100 enters a beam splitter 201, where a part of the laser beam is taken out. This taken-out laser beam is expanded by a diffusing plate (or a lens for expanding the laser beam) 202, whereby a wave number spectrum corresponding to the wavelength is obtained by a Fabry-Pérot etalon 203 for monitoring.

As the Fabry-Pérot etalon 203 for monitoring, use is made of a Fabry-Pérot etalon of the type in which the free spectral range (FSR) is determined appropriately (0.01–0.02 nm) and like the Fabry-Pérot etalon constituting the wavelength selecting element 104, the mirror surface spacing is fixed. From this, the wave number spectrum of the oscillated laser beam can be taken out. The wave number spectrum thus obtained is transmitted through a lens 204 and enters a spectral detector 205 such as a linear array detector comprising a CCD, a PCD (plasma coupled device) or the like, whereby an interference fringe determined by the spectrum is detected.

The spectrum (interference fringe distribution) detected in the spectral detector 205 is input to a wavelength monitor 206, in which the spectral characteristic in the wavelength selecting element 104 is observed. The components from the diffusing plate 202 to the wavelength monitor 206 constitute a wavelength monitoring device 200.

The spectrum signal output from the detector 205 is also input to a controller 20. The controller 20 finds the amount of fluctuation of the wavelength from the set wavelength of the pre-input laser beam and the spectrum of the laser beam detected by the wavelength monitoring device 200, and suitably feedback-controls the angle of inclination of the etalon 104 on the basis of said amount of fluctuation of the wavelength through an actuator 21. The wavelength monitoring device 200, the controller 20 and the actuator 21 together constitute a wavelength stabilizing device so as to accurately narrow the wavelength of the laser beam and stabilize the central wavelength thereof and the wavelength range.

The laser beam transmitted through the beam splitter 201 enters an illuminating optical system 302 via a reflecting mirror 301. The laser beam having emerged from the illuminating optical system 302 irradiates a mask 303, and a pattern on the mask 303 is reduction-projected onto a wafer 305 placed on a wafer stage 306, through a projection lens 304 which is telecentric at both sides or at one side. In the present embodiment, use is made of an optical system which is non-telecentric at the mask 303 side and telecentric at the wafer 305 side.

An optical characteristic control device 307 corrects the fluctuation of an optical characteristic of the projection lens 304 caused by the influences of a variation in the atmospheric pressure, a variation in the atmospheric temperature and the irradiation energy of the exposure light, i.e., the fluctuation of the projection magnification or of the focus position. The projection lens 304 and the optical characteristic control device 307 are disclosed, for example, in U.S. Pat. No. 4,666,273 and therefore, need not be described in detail herein. Stated briefly, a plurality of portions of the lens space in the projection lens 304 are made into air chambers shielded from the atmosphere and the pressure in these air chambers is adjusted to correct the optical characteristic of the projection lens 304 itself. The fluctuation of the performance of this projection lens itself is prevented by the optical characteristic control device 307 and therefore, if the wavelength of the laser beam is stable, that is, if the central wavelength coincides with the set wavelength (absolute value) and the amount of fluctuation of this wavelength is within a predetermined value (±0.001 nm), a stable projection magnification and a stable focus position can always be obtained.

So, in order to obtain the stable projection magnification and stable focus position of the projection lens, the wavelength stabilizing device is used to feedback-control the wavelength of the laser beam as described above. However, such feedback control alone may cause serious malfunctioning for the reason set forth below.

The wavelength of the laser beam output from the excimer laser source 100 fluctuates to a certain degree at the start of the oscillation of the laser due to the influences of the angle of inclination of the etalon 104, the atmospheric temperature, the atmospheric pressure, etc. Malfunctioning occurs when the then deviation of the wavelength is more than one half of the free spectral rang of the etalon 203 for monitoring.

That is, from the viewpoint of the characteristic of the Fabry-Pérot etalon, interference fringes of the same multiplex interference are obtained for a wavelength deviation integer times as great as the free spectral range. For example, where the free spectral range of the etalon 203 for monitoring is set to 0.02 nm, the spectrum detected when the wavelength has changed by integer times 0.02 nm is entirely similar to the spectrum detected when the central wavelength of the oscillated laser beam is exactly coincident with the set wavelength.

Thus, when at the start of the oscillation of the laser, the wavelength of the laser beam changes by more than one half of the free spectral range (in this case, 0.01 nm), even if the above-described feedback control is effected, the controller 20 effects the feedback control of the angle of inclination of the wavelength selecting etalon 104 through the actuator 21 so that the central wavelength of the laser beam is stabilized to a wavelength differing from the set wavelength by 0.2 nm (or integer times 0.02 nm).

So, in order to prevent malfunctioning, the present embodiment is designed such that the fluctuation of the wavelength of the laser beam is detected by the use of the characteristic measuring device of the projection optical system provided in the exposure apparatus, the wavelength of the laser beam is controlled by the controller 10, and after this control, the wavelength of the laser beam is feedback-controlled by the wavelength monitoring device 200 or the like. This characteristic measuring device of the projection optical system is disclosed in U.S. Pat. No. 4,629,313 and therefore, only the function regarding the present embodiment will be described briefly herein.

Two light-transmitting cruciform fiducial marks M1 and M2 are provided on the underside of a mask 303 at predetermined locations. The laser beam transmitted through the marks M1 and M2 enters the projection lens 304. The light beam having emerged from the projection lens 304 is imaged on a slit member on the two-dimensionally movable wafer stage 306. This slit member has a surface formed with a pair of slits S1 and S2, and said surface, like the wafer, is conjugate with the pattern surface of the mask with respect to the projection lens. The spacing between the pair of slits S1 and S2 is set equal to the spacing between the projected images of the marks M1 and M2 of the mask by the projection lens. Further, below the slit member, a pair of photoelectric detectors 308 are provided so as to receive the lights transmitted through the corresponding slits S1 and S2.

Thus, by moving the wafer stage 306, the pair of slits S1 and, S2 scan the projected images of the marks M1 and M2 and detection signals output from the photoelectric detectors 308 are input to the controller 10. The controller 10 determines the relative positional relation between the projected images of the marks M1, M2 and the slits S1, S2 on the basis of the detection signals and the position information of a laser interferometer 309, and stores it in a register. Further, the controller 10 determines the amount of fluctuation of the projection magnification from the spacing between the projected images of the marks M1 and M2 and the design spacing between the projected images pre-input to the register, and stores it therein.

Accordingly, assuming that the optical characteristic control device 307 is sequentially correcting the fluctuation of the optical characteristic of the projection lens 304 caused by a variation in the atmospheric pressure, a variation in the atmospheric temperature, the irradiation energy of the exposure light, etc., the measured fluctuation of the projection magnification may be said to have been caused by the aberration due to the wavelength deviation of the laser beam output from the laser source 100.

In the exposure apparatus of this type, calibration, i.e., the set-up of the offset measurement of the alignment system of the exposure apparatus, the focus position adjustment, the measurement of the fluctuation of the projection magnification, etc., is effected without fail at the starting of the apparatus. Accordingly, the fluctuation of the projection magnification caused by the wavelength deviation of the laser beam is adjusted as follows during the calibration effected at the starting of the exposure apparatus.

At a point of time whereat the excimer laser source 100 is oscillated and the central wavelength of the laser beam thereof becomes stable to a certain degree, the controller 10 finds the amount of fluctuation of the projection magnification as described above. On the basis of this amount of fluctuation, the controller 10 determines the amount of wavelength deviation of the laser beam and stores this determined value therein.

In the case of the projection lens 304 in the present embodiment, if the wavelength of the laser beam output from the laser source 100 deviates by 0.001 nm, the projected image shifts by about 0.02 $\mu$m at the image height 10 mm of the projected image projected onto the wafer. Therefore the controller 10 repetitively effects the above-described position measurement, and thus measures the position of the projected image at an accuracy of the order of 0.05 $\mu$m and finds the amount of wavelength deviation of the laser beam at an accuracy of ±0.0025 nm.

Subsequently, the controller 10 determines the amount of variation in the angle of inclination of the wavelength selecting Fabry-Pérot etalon 104 necessary to adjust the thus found wavelength deviation of the laser beam. In accordance with this determination by the controller 10, the controller 20 controls the angle of inclination of the etalon 104 through the actuator 21. As a result, the amount of wavelength deviation of the laser beam is held within ±0.0025 nm. Further, after this control has been effected, the controller 20 finds the amount of wavelength deviation from the set wavelength of the pre-input laser beam and the spectrum of the laser beam detected by the wavelength monitoring device 200, in order to adjust the wavelength deviation of the laser beam. On the basis of this amount of wavelength deviation, the controller 20 suitably feedback-controls the angle of inclination of the etalon 104 through the actuator 21.

Thus, the central wavelength of the laser beam output from the laser source 100 coincides with the set wavelength and the amount of wavelength deviation is held within a predetermined value (±0.001 nm).

Figure 2:
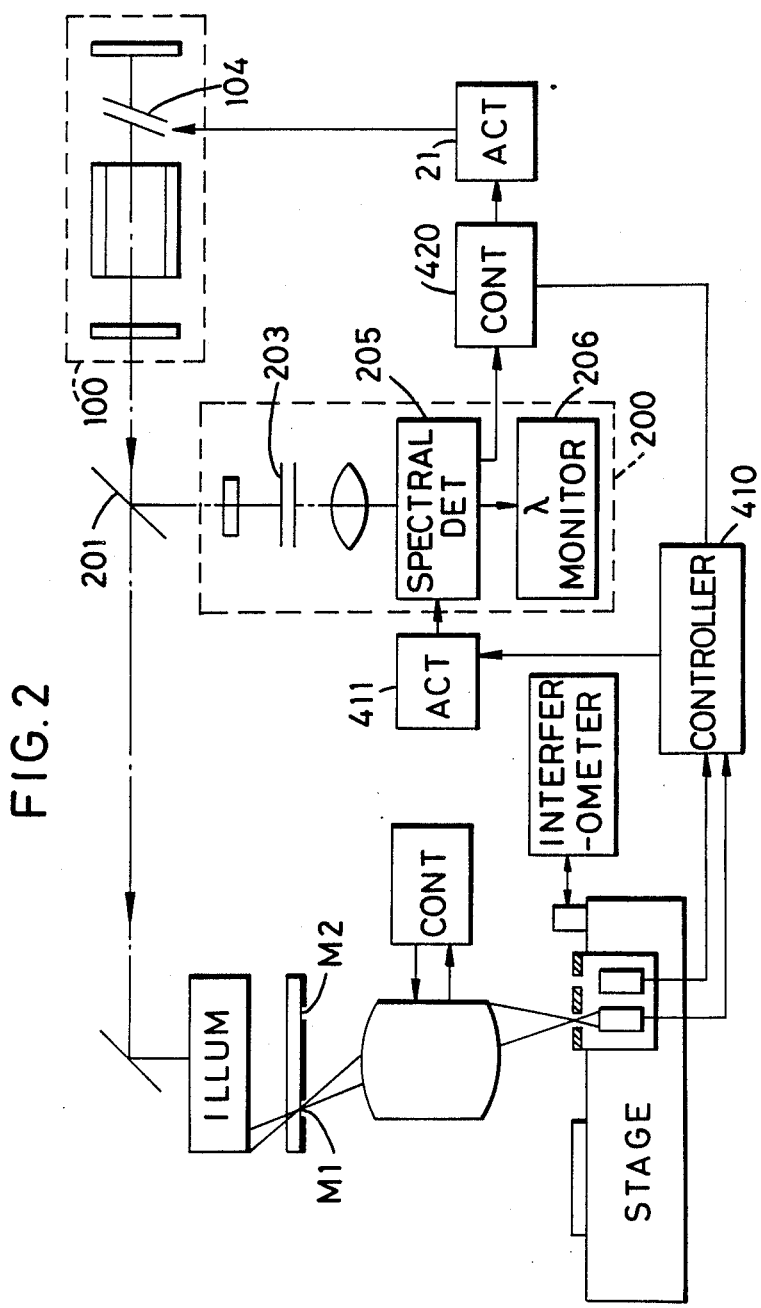
FIG. 2 is a diagram schematically showing the construction of an exposure apparatus provided with an excimer laser device according to a second embodiment of the present invention.

A second embodiment of the present invention will now be described with reference to FIG. 2. The second embodiment is designed such that on the basis of the result of the measurement of the output wavelength deviation of the laser source, the position of the spectral detector of the wavelength monitoring device is moved relative to the interference fringe.

As in the first embodiment, on the basis of the amount of fluctuation of the projection magnification determined at a point of time whereat the excimer laser source 100 is oscillated and the central wavelength of the laser beam thereof becomes stable to a certain degree, a controller 410 determines the amount of wavelength deviation of the laser beam and stores it therein.

Here, in order to accurately detect the spectrum (interference fringe distribution) of the laser beam by the wavelength monitoring device 200, the controller 410 corrects the position of the spectral detector 205 relative to the interference fringes. For this purpose, as in the first embodiment, the measurement of the positions of the projected images of the fiducial marks M1 and M2 between two points spaced apart from each other by about 20 mm (±10 mm) at the full angle of view of the projection lens is effected repetitively, whereby the positions of the projected images are measured at an accuracy of 0.04 $\mu$m, and the amount of wavelength deviation of the laser beam is found at an accuracy of ±0.001 nm.

Next, the controller 410 determines the necessary amount of movement of the detector 205 from the thus found amount of wavelength deviation, and on the basis of this determined value, it moves the detector 205 through an actuator 411 by a necessary amount in the direction of arrange men of the interference fringes.

Subsequently, the controller 420 finds the amount of wavelength deviation from the set wavelength the pre-input laser beam and the spectrum of the laser beam detected by the wavelength monitoring device 200, in order to adjust the wavelength deviation of the laser beam. On the basis of this amount of wavelength deviation, the controller 420 suitably feedback-controls the angle of inclination of the etalon 104 through the actuator 21.

Accordingly, the central wavelength of the laser beam output from the laser source 100 coincides with the set wavelength and the amount of wavelength deviation is held within a predetermined value (±0.001 nm).

When the necessary amount of movement determined by the controller 410 is greater relative to the range of movement of the detector 205, the necessary amount of movement can be made small if a program is set such that the controller 420 preliminarily adjusts the angle of inclination of the etalon 104 through the actuator 21 to a certain degree.

After the position of the detector 205 is moved, the controller 410 again finds the amount of fluctuation of the projection magnification. On the basis of this amount of fluctuation of the projection magnification, the controller 410 judges whether the detector 205 accurately detects the spectrum of the laser beam. As a result, when the detector 205 accurately detects the spectrum, the controller 420 compares the spectrum of the laser beam detected by the wavelength monitoring device 200 with the design wavelength in the same manner as the above-described operation and finds the amount of wavelength deviation, and feedback-controls the angle of inclination of the etalon 104. Thereby the wavelength deviation of the laser beam is held within ±0.001 nm.

Also, when the detector 205 does not detect the spectrum, the controller 410 again effects the above-described preliminary adjustment.

In each of the above-described embodiments, by measuring the amount of fluctuation of the focus position of the projection optical system and determining the amount of wavelength deviation on the basis of this amount of fluctuation, a similar effect can be obtained.

Further, even if a device of such a construction as described below is used instead of the characteristic measuring device of the projection optical system used in each of the above-described embodiments, the fluctuation of the projection magnification can be found as in the above-described embodiments.

A slit plate having a plurality of rectangular slits is provided on a wafer stage so as to be conjugate with the pattern surface of a mask with respect to the projection lens. Further, an illuminating system having a light source supplying light of the same wavelength as the exposure light which illuminates the slit plate from the inside thereof is provided. The design is such that light transmitted through the slit plate is transmitted through the projection lens, the mask and the illuminating optical system and the light reflected by a reflecting mirror passes through a relay optical system, etc. to a photoelectric detector. This photoelectric detector is provided at a location substantially optically conjugate with the pupil of the projection lens and is set so as to have a light-receiving surface substantially equal to the image of the pupil. The wafer stage is then moved and a fiducial mark provided on the mask is scanned by the image of a light-emitting slit. The position in which the mark of the mask and the light-emitting slit overlap each other at this time can be found in advance from the design data and therefore, if distortion exists in the projection lens, there occurs a deviation between the mark of the mask and the light-emitting slit, or a spacing deviation between the projected images of a plurality of marks of the mask. This deviation is detected by a photo-electric detector and a laser interferometer and further, on the basis of the detection signal, the controller finds the fluctuation of the projection magnification.

Alternatively, after the printing of the pattern of a test mask onto the wafer is effected, the coordinates value of the wafer stage is set on the basis of the design data of the pattern of the test mask, and then the test mask is exposed again and superposition-printed. On the basis of a mark (or a latent image) thus formed by the superposition printing, the amount of deviation between marks is measured by the use of the alignment optical system of the apparatus, whereby the fluctuation of the projection magnification can be found.

Where, as the wavelength selecting Fabry-Pérot etalon, use is made of a Fabry-Pérot etalon of the air gap type, i.e., the type which is provided with a retractile member such as a piezo element and in which this retractile member is expanded or contracted through a driving portion to thereby finely adjust the air gap, it is apparent that a similar effect can also be obtained if the air gap is controlled in conformity with the amount of wavelength deviation.

I claim:

1. An exposure apparatus comprising:
   a projection optical system employing a light beam to project an image of an object on a first plane onto a second plane;
   laser means for outputting said light beam to said projection optical system;
   measuring means for detecting fluctuation of an optical characteristic of said projection optical system attributable to deviation of the wavelength of said light beam output from said laser means; and
   control means responsive to said measuring means for adjusting the wavelength of said light beam.

2. An exposure apparatus according to claim 1, wherein said laser means includes a wavelength selecting element for narrowing a wavelength bandwidth of said light beam output from said laser means.

3. An exposure apparatus according to claim 1, wherein said measuring means includes fiducial mark means provided on said first plane, means for detecting the position of an image of said fiducial mark means projected onto said second plane, and means for detecting the fluctuation of said optical characteristic from the detected position of said image of said fiducial mark means.

4. An exposure apparatus according to claim 1, wherein said control means determines an amount of deviation of the wavelength of said light beam from a standard wavelength on the basis of said detected fluctuation of the optical characteristic.

5. An exposure apparatus according to claim 1, further comprising stabilizing means operable to monitor the wavelength of a part of the output light beam and stabilize said wavelength to a predetermined condition, said stabilizing means becoming operative after the adjustment of said wavelength by said control means is completed.

6. An exposure apparatus according to claim 5, wherein said stabilizing means includes spectral detecting means for detecting an interference fringe determined by the spectrum of said output light beam, means for determining the amount of deviation of the wavelength of said light beam on the basis of the position of the interference fringe detected by said spectral detecting means, and means for changing the wavelength of said light beam correspondingly to said determined amount of deviation.

7. An exposure apparatus comprising:
   a projection optical system employing a light beam to project an image of an object on a first plane onto a second plane;
   laser means for outputting said light beam to said projection optical system;
   measuring means for detecting fluctuation of an optical characteristic of said projection optical system attributable to deviation of the wavelength of said light beam output from said laser means; and
   rough adjusting means responsive to said measuring means to roughly adjust the wavelength of said light beam;
   fine adjusting means provided to finely adjust the wavelength of said light beam, discretely from said rough adjusting means; and
   control means for operating said fine adjusting means after the completion of the rough adjustment by said rough adjusting means.

8. An apparatus comprising:
   a refraction optical system for passing a laser beam;
   means for supplying a laser beam to said refraction optical system;
   means for receiving the laser beam passed through said refraction optical system and for the detecting fluctuation of an optical characteristic of said refraction optical system attributable to deviation of the wavelength of said laser beam;

means for determining an amount of deviation of the wavelength said laser beam from a standard wavelength on the basis of said fluctuation of the optical characteristic; and control means responsive to said determining means for adjusting the wavelength of said laser beam.

9. An apparatus according to claim 8, wherein said supplying means includes a laser source generating said laser beam and capable of selecting the wavelength of said laser beam, and said control means includes means for monitoring the wavelength of said laser beam from said laser source and for controlling said laser source to adjust the wavelength of said laser beam in response to said determining means and said monitoring means.

10. An apparatus according to claim 9, wherein said laser source includes a wavelength selecting element constituted by a Fabry-Pérot etalon, and wherein said monitoring means includes a Fabry-Pérot etalon having a determined free spectral range.

11. An apparatus according to claim 10, wherein said control means includes means for adjusting the angle of inclination of said Fabry-Pérot etalon of said laser source.

* * * * *